US008861627B2

United States Patent
Voinigescu et al.

(10) Patent No.: US 8,861,627 B2
(45) Date of Patent: Oct. 14, 2014

(54) DIRECT MM-WAVE M-ARY QUADRATURE AMPLITUDE MODULATION (QAM) MODULATOR OPERATING IN SATURATED POWER MODE

(75) Inventors: Sorin P. Voinigescu, Ontario (CA); Alexander Tomkins, Toronto (CA); Magnus O. Wiklund, San Jose, CA (US); William Warren Walker, Los Gatos, CA (US)

(73) Assignee: Fujitsu Limited, Kawasaki-shi (JP)

( * ) Notice: Subject to any disclaimer, the term of this patent is extended or adjusted under 35 U.S.C. 154(b) by 1477 days.

(21) Appl. No.: 12/503,708

(22) Filed: Jul. 15, 2009

(65) Prior Publication Data

US 2011/0013726 A1    Jan. 20, 2011

(51) Int. Cl.
| | |
|---|---|
| *H04L 5/12* | (2006.01) |
| *H04B 15/00* | (2006.01) |
| *H01Q 3/00* | (2006.01) |
| *H04L 27/36* | (2006.01) |
| *H03D 7/14* | (2006.01) |
| *H03C 1/36* | (2006.01) |
| *H03D 7/16* | (2006.01) |

(52) U.S. Cl.
CPC .............. *H04L 27/36* (2013.01); *H03D 7/1458* (2013.01); *H03C 2200/0025* (2013.01); *H03C 1/36* (2013.01); *H03D 7/165* (2013.01); *H03D 2200/0084* (2013.01); *H03D 7/1441* (2013.01)
USPC ........................... 375/261; 375/285; 342/368

(58) Field of Classification Search
CPC .... H03D 2200/0082; H03D 1/24; H03D 5/00
USPC ................................... 375/261, 285; 342/368
See application file for complete search history.

(56) References Cited

U.S. PATENT DOCUMENTS

| | | | | |
|---|---|---|---|---|
| 3,285,068 | A | * | 11/1966 | Morris ........................ 73/304 C |
| 3,972,000 | A | * | 7/1976 | Desblache et al. ............ 375/350 |
| 4,079,650 | A | * | 3/1978 | Deutsch et al. ................ 84/627 |
| 5,675,590 | A | * | 10/1997 | Alamouti ...................... 714/786 |

(Continued)

FOREIGN PATENT DOCUMENTS

WO    WO 2007/090929    8/2007

OTHER PUBLICATIONS

R. C. Frye et al., "A 2-GHz Quadrature Hybrid Implemented in CMOS Technology," IEEE J. Solid-State Circuits, vol. 38, No. 3, pp. 550-555, Mar. 2003.

(Continued)

*Primary Examiner* — Leon-Viet Nguyen
*Assistant Examiner* — Sarah Hassan
(74) *Attorney, Agent, or Firm* — Baker Botts L.L.P.

(57) ABSTRACT

In one embodiment, a circuit comprises a first pair of elements, a second pair of elements, a combiner, and a signal output. Each element in the first and second pair of elements comprises an amplitude-control input for receiving an amplitude-control bit, a phase-control input for receiving a phase-control bit, a signal input for receiving an input signal, a modulator for producing an output signal based on the amplitude-control bit, the phase-control bit, and the input signal, and an signal output for transmitting the output signal to the combiner. The combiner combines the two output signals from the first and second pair of elements to produce an output signal for the circuit to be transmitted by the signal output of the circuit.

13 Claims, 8 Drawing Sheets

(56) References Cited

U.S. PATENT DOCUMENTS

| | | | |
|---|---|---|---|
| 5,903,609 A * | 5/1999 | Kool et al. | 375/261 |
| 6,160,855 A * | 12/2000 | Nakamura et al. | 375/280 |
| 6,996,191 B1 * | 2/2006 | Meditz | 375/308 |
| 7,164,328 B2 | 1/2007 | Yuan et al. | |
| 2001/0019249 A1 * | 9/2001 | Kato et al. | 318/254 |
| 2002/0075943 A1 * | 6/2002 | Kurihara | 375/146 |
| 2003/0038745 A1 * | 2/2003 | Lalezari et al. | 342/368 |
| 2004/0004516 A1 * | 1/2004 | Maniwa | 330/149 |

OTHER PUBLICATIONS

Lee et al., "SiGe BiCMOS 65-GHz BPSK Transmitter and 30 to 122 GJz :C-Varactor VCOs with up to 21% Tuning Range," IEEE CSICS, Monterey, CA, Technical Digest, pp. 179-182, Oct. 2004.

Trotta et al., "A 79 GHz SiGe-BiPolar Spread-Spectrum TX for Automotive Radar," IEEE ISSCC-Digest, pp. 430-431, Feb. 2007.

Tomkins et al., A Zero-IF 60 GHz Transceiver in 65 nm CMOS with > 3.5 Gb/s Links, accepted at the 2008 IEEE CICC, San Jose, California, Sep. 2008.

McPherson et al., "Vector Modulator for W-band Software Radar Techniques," IEEE Trans. MTT, vol. 49, No. 8, pp. 1451-1461, 2000.

Wang et al., "A 60GHz low-power six-port transceiver for gigabit software-defined transceiver applications," in ISSCC Dig. Tech., Feb. 2007, pp. 192-193.

Eloranta et al., "A Multimode Transmitter in 0.13 um CMOS Using Direct-Digital RF Modulator," IEEE JSSC, vol. 42, No. 12, pp. 2774-2784, Dec. 2007.

Jerng et al., "A Wideband Delta-Sigma Digital-RF Modulator for High Data Rate Transmitters," IEEE JSSC, vol. 42, No. 8, pp. 1710-1722, 2007.

* cited by examiner

DIRECT MM-WAVE M-ARY QUADRATURE AMPLITUDE MODULATION (QAM) MODULATOR OPERATING IN SATURATED POWER MODE

TECHNICAL FIELD

This disclosure relates generally to amplitude and phase modulators.

BACKGROUND

In telecommunications, modulation is the process of varying a periodic waveform (such as a local oscillator (LO) signal or a radio frequency (RF) signal represented as a high-frequency (HF) sinusoid waveform) to convey a message with the signal. A sine wave has three parameters—amplitude, frequency, and phase—which may all be modified according to a control signal, e.g., a low-frequency information signal, to obtain the modulated signal. An electronic device that performs modulation is generally known as a modulator. An electronic device that performs the inverse operation of modulation is generally known as a demodulator.

There are various techniques for the modulation process, one of which is digital modulation. With digital modulation, an analog carrier signal is modulated by a digital bit stream. Example digital modulation techniques include amplitude-shift keying (ASK), frequency-shift keying (FSK), and phase-shift keying (PSK).

DESCRIPTION OF EXAMPLE EMBODIMENTS

Figure 1A:
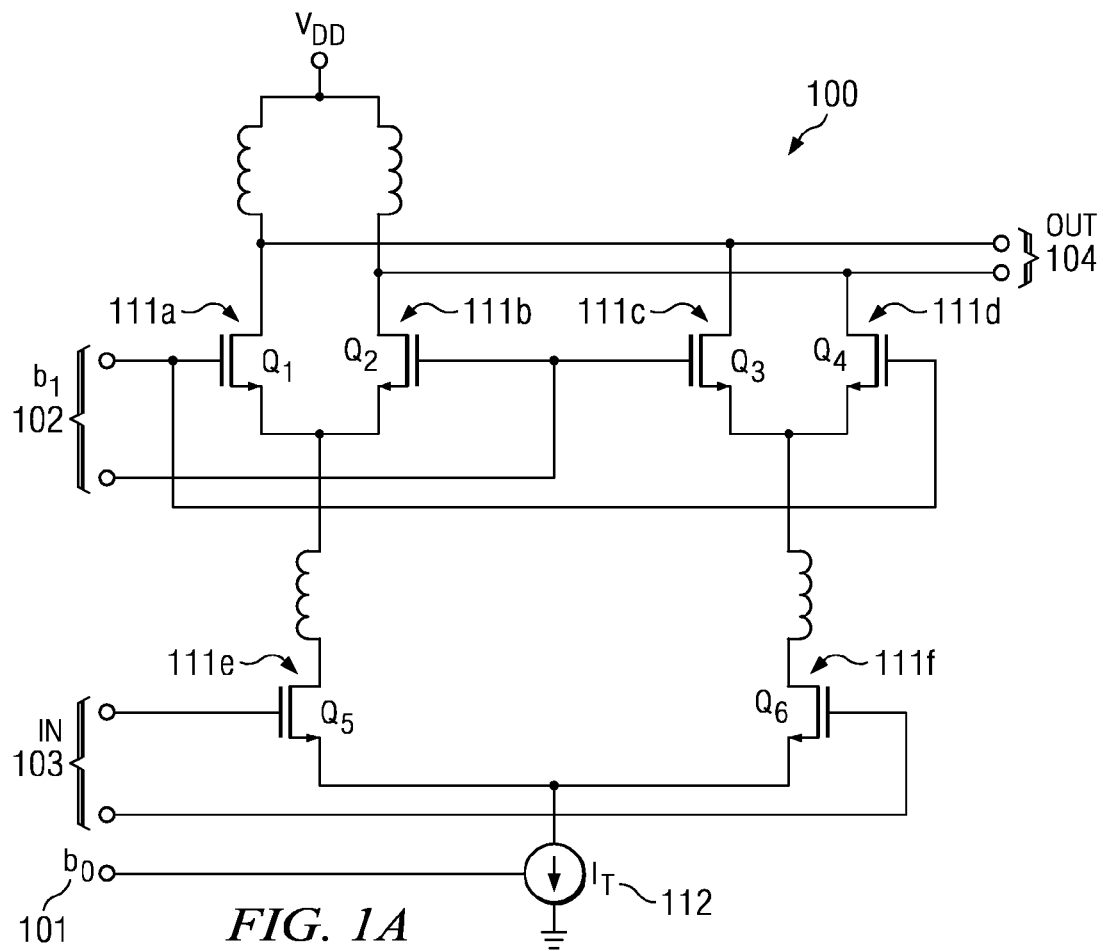
FIG. 1A illustrates an example amplitude-phase component.

Modulation facilitates the transfer of information over a medium. In telecommunications, there are various modulation techniques, such as, for example, analog modulation, digital modulation, and pulse modulation. With digital modulation, the aim is typically to transfer a digital bit stream over an analog bandpass channel. Digital modulation schemes transform digital signals into waveforms that are compatible with the nature of the communications channel. In some cases, digital modulation methods may be considered digital-to-analog conversion and the corresponding digital demodulation methods may be considered analogy-to-digital conversion.

In general, a modulator receives an input signal, modifies one or more parameters of the input signal based on one or more control signals to produce an output signal, and transmits the output signal. The input signal is typically a sinusoid waveform, and a sinusoid waveform has three different parameters-amplitude, frequency, and phase-which may all be modified. Example digital modulation techniques include ASK, FSK, and PSK. ASK is a form of digital modulation that represents digital data as variations in the amplitude of a carrier wave. FSK is a form of digital modulation that represents digital data as variations in the frequency of a carrier wave. PSK is a form of digital modulation that represents digital data as variations in the phase of a carrier wave.

With respect to these digital modulation techniques, there are more specific modulation techniques. For example, quadrature amplitude modulation (QAM) conveys two digital bit streams by simultaneously modulating the amplitude and phase of a carrier wave. Common forms of QAM include, for example, 16-QAM, 64-QAM, 128-QAM, and 256-QAM, with higher order being able to transmit more bits per symbol. Binary PSK (BPSK) is a relatively simple and yet robust form of PSK. BPSK uses two phases that are separated by 180°. Quadrature PSK (QPSK) is another form of PSK that uses four phases separated by 90°. QPSK is able to encode two bits per symbol, which is twice the rate of BPSK. Other examples of modulation techniques include, for example, 8-PSK, 16-PSK, differential PSK (DPSK), on-off keying (OOK), minimum-shift keying (MSK), continuous phase modulation (CPM), multi-frequency shift keying (AFSK), and orthogonal frequency division multiplexing (OFDM).

Sometimes, certain modulation techniques have technical or design constraints. For example, higher order modulations such as 16-QAM and 64-QAM are typically implemented digitally at baseband and quadrature (IQ) up-conversion is then employed to modulate the carrier wave, e.g., 60 GHz local oscillator (LO) or radio frequency (RF) signals. Such single-sideband radio transmitter architecture is versatile, transparent to the modulation scheme, and makes efficient use of the available bandwidth. However, for modulation techniques that involve different amplitude levels, such as 16-QAM and 64-QAM, this architecture imposes stringent linearity constraints on the up-converter and on the entire RF path. For example, to avoid degradation of the 16-QAM signal, e.g., error vector magnitude (EVM) increase and spectral re-growth, the power amplifier is typically backed off by up to 6 dB from its 1 dB output compression point. In a 1.2V, 60 GHz complementary metal-oxide-semiconductor (CMOS) radio, the penalty on the power amplifier (PA) efficiency may be intolerable, especially as it is difficult to realize PAs with an output compression point that exceeds +10 dBm to +12 dBm.

To address this problem, in particular embodiments, the radio transceiver uses a 16-QAM modulator, which directly modulates the 60 GHz LO signal. Since the modulator is the last block in the transmitter, and if certain design conditions are met, it may be operated in saturation mode with an output power larger than +10 dBm and without requiring any back-off. In fact, in particular embodiments, the modulator may be regarded as a switched PA or as a multi-bit (such as, for example, at least 4 bits) DAC.

In particular embodiments, an amplitude-phase component receives an amplitude-control bit, a phase-control bit, and an input signal, and transmits an output signal that is produced based on the input signal and the values of both the amplitude-control bit and the phase-control bit. The output signal has an amplitude and a phase that may be in one of three potential states. In particular embodiments, the amplitude-phase component has multiple differential pairs of transistors and may be extended to become a binary-weighted DAC by segmenting and grouping the gates of some or all of the differential pairs of transistors.

In particular embodiments, a 16-QAM modulator may be formed with two pairs of the amplitude-phase components connected in parallel. The scale ratio between the two pairs of amplitude-phase components is approximately or precisely 1:2. Furthermore, in particular embodiments, a 64-QAM modulator may be formed with three pairs of the amplitude-phase components connected in parallel. The scale ratio between the three pairs of amplitude-phase components is approximately or precisely 1:2:4. In each pair, the two amplitude-phase components are driven by input signals of identical frequency and 90° out of phase with respect to each other (i.e. quadrature input signals).

FIG. 1A illustrates an example amplitude-phase component 100. In particular embodiments, amplitude-phase component 100 has three pairs of transistors: the first pair including transistors 111a and 111b, the second pair including transistors 111c and 111d, and the third pair including transistors 111e and 111f. A signal input 103 is connected to transistors 111e and 111f. A signal output 104 is connected to transistors 111a-111d. Input signals to amplitude-phase component 100 are received at signal input 103, and output signals from amplitude-phase component 100 are transmitted from signal output 104. In particular embodiments, input signals to amplitude-phase component 100 may be LO signals or RF signals, and output signals from amplitude-phase component 100 may be RF signals. An amplitude-control bit 101 is connected to a current source 112. A phase-control bit 102 is connected to transistors 111a-111d.

Figure 1B:
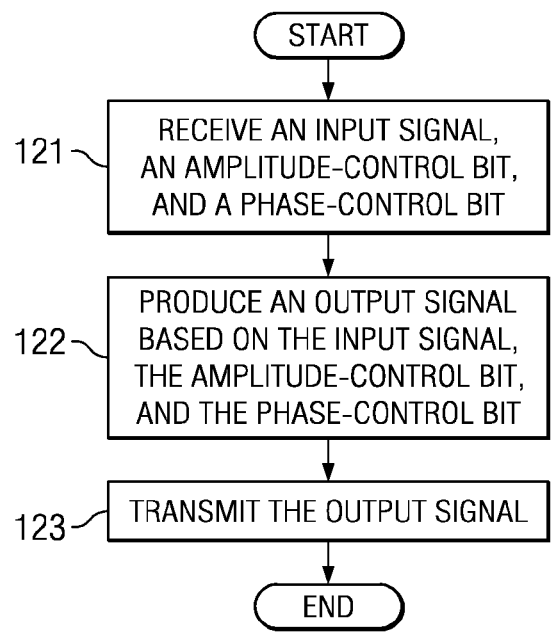
FIG. 1B illustrates an example process performed by an amplitude-phase component.

In particular embodiments, an output signal is produced based on an input signal and the values of amplitude-control bit 101 and phase-control bit 102. FIG. 1B illustrates an example process performed by amplitude-phase component 100 to produce an output signal based on an input signal and the values of amplitude-control bit 101 and phase-control bit 102. At step 121, amplitude-phase component 100 receives the input signal at signal input 103 and the values of amplitude-control bit 101 and phase-control bit 102. At step 122, an output signal is produced based on the input signal and the values of amplitude-control bit 101 and phase-control bit 102 as described in more detail below. At step 123, amplitude-phase component 100 transmits the output signal from signal output 104.

More specifically, in particular embodiments, the input signal is an analog signal, e.g., an LO signal or an RF signal, and may be represented as a sinusoid waveform. As explained above, a sine wave has three parameters-amplitude, frequency, and phase-which may all be modulated. Modulating the amplitude, the frequency, or the phase of a signal means modifying or varying the amplitude, the frequency, or the phase of the signal. Similarly, the output signal, e.g., an RF signal, also has three parameters: amplitude, frequency, and phase.

Amplitude-phase component 100 does not modify the frequency of the input signal. Thus, the frequency of the output signal, when its amplitude is not 0, is the same as the frequency of the input signal. When the amplitude of the output signal is 0, the frequency and the phase of the output signal are irrelevant. On the other hand, amplitude-phase component 100 may modify either the amplitude or the phase or both of the input signal to obtain the amplitude and the phase of the output signal. In particular embodiments, the amplitude of the output signal may be determined based on the amplitude of the input signal and the value of amplitude-control bit 101 may control modification of the amplitude of the input signal to produce the amplitude of the output signal. Similarly, the phase of the output signal may be determined based on the phase of the input signal and the value of phase-control bit 102 may control modification of the phase of the input signal to produce the phase of the output signal.

In particular embodiments, amplitude-control bit 101 and phase-control bit 102 are both digital signals having a single bit. Thus, the two possible values of amplitude-control bit 101 and phase-control bit 102 are binary 0 and binary 1.

In particular embodiments, amplitude-control bit 101 controls the amplitude of the output signal to be in one of two possible states: (1) the amplitude of the output signal represents binary 0, e.g., 0 amplitude; or (2) the amplitude of the output signal represents binary 1, e.g., being the same as the amplitude of the input signal. The two possible values of amplitude-control bit 101 may correspond to the two possible states of the amplitude of the output signal in either way. For example, suppose that when amplitude-control bit 101 is binary 0, the amplitude of the output signal represents binary 0, and when amplitude-control bit 101 is binary 1, the amplitude of the output signal represents binary 1.

Phase-control bit 102 controls the phase of the output signal to be in one of two possible states: (1) the phase of the output signal represents binary 0, e.g., being the same as the phase of the input signal; or (2) the phase of the output signal represents binary 1, e.g., shifting 180° from the phase of the input signal. The two possible values of phase-control bit 102 may correspond to the two possible states of the phase of the output signal in either way. For example, suppose that when phase-control bit 102 is binary 0, the phase of the output signal represents binary 0, and when phase-control bit 102 is binary 1, the phase of the output signal represents binary 1.

In particular embodiments, the output signal, which is produced based on the input signal and the values of amplitude-control bit 101 and phase-control bit 102, may be in one of three potential states: (I) the amplitude of the output signal represents binary 0; (II) the amplitude of the output signal represents binary 1 and the phase of the output signal represents binary 0; or (III) the amplitude of the output signal represents binary 1 and the phase of the output signal represents binary 1. Note that with state (I), the phase of the output signal is irrelevant because when the amplitude of the output signal represents binary 0, in particular embodiments, the output signal has 0 amplitude.

Which of the three potential states the output signal is in depends on the values of both amplitude-control bit 101 and phase-control bit 102. Since both amplitude-control bit 101 and phase-control bit 102 are single bits, their values may be either a binary 0 or a binary 1. In particular embodiments, if amplitude-control bit 101 is binary 0 and phase-control bit 102 is binary 0 or binary 1, the output signal is in state (I); if amplitude-control bit 101 is binary 1 and phase-control bit 102 is binary 0, the output signal is in state (II); and if amplitude-control bit 101 is binary 1 and phase-control bit 102 is binary 1, the output signal is in state (III). The following TABLE 1 summarizes the relationships between the values of amplitude-control bit 101 and phase-control bit 102 and the specific state the output signal is in.

TABLE 1

| State | Amplitude-Control Bit | Phase-Control Bit | Output Signal |
|---|---|---|---|
| I | 0 | 0 1 | amplitude represents binary 0; phase irrelevant |
| II | 1 | 0 | amplitude represents binary 1; phase represents binary 0 |
| III | 1 | 1 | amplitude represents binary 1; phase represents binary 1 |

Figure 2A:
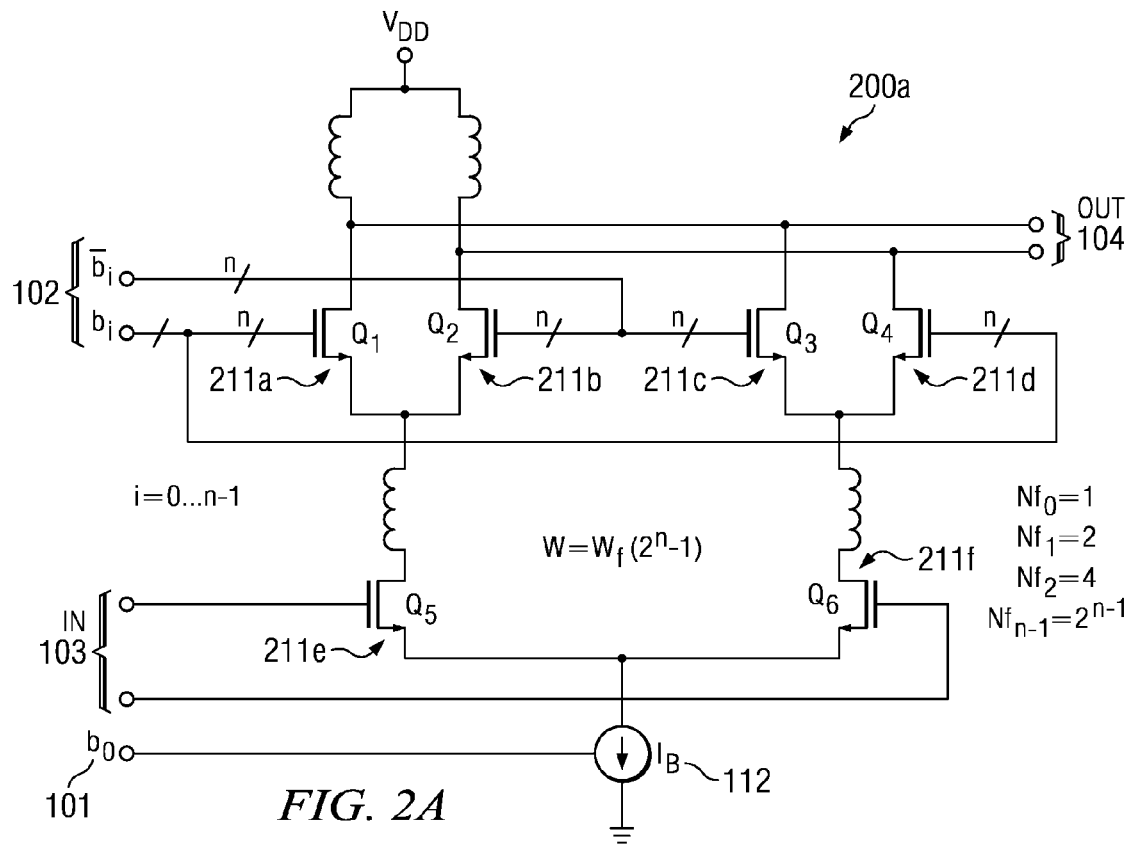
FIG. 2A illustrates an example binary-weighted digital-to-analog converter (DAC).

In particular embodiments, an amplitude-phase component, e.g., amplitude-phase component 100, may be modified to become a binary-weighted DAC. FIG. 2A illustrates an example circuit diagram of a binary-weighted DAC 200a extended from an amplitude-phase component. In particular embodiments, similar to amplitude-phase component 100, binary-weighted DAC 200a has three pairs of transistors: the first pair including transistors 211a and 211b, the second pair including transistors 211c and 211d, and the third pair including transistors 211e and 211f.

A signal input 103 is connected to transistors 211e and 211f. A signal output 104 is connected to transistors 211a-211d. Input signals to binary-weighted DAC 200a are received at signal input 103, and output signals from binary-weighted DAC 200a are transmitted from signal output 104. In particular embodiments, input signals to binary-weighted DAC 200a may be LO signals, and output signals from amplitude-phase component 100 may be RF signals.

An amplitude-control bit 101 is connected to a current source 112. Multiple phase-control bits 102 are connected to the individual gates of transistors 211a-211d. In particular embodiments, amplitude-control bit 101 and the phase-control bits 102 are all digital signals. Thus, the two possible values of amplitude-control bit 101 and of the phase-control bits 102 are binary 0 and binary 1.

Figure 2B:
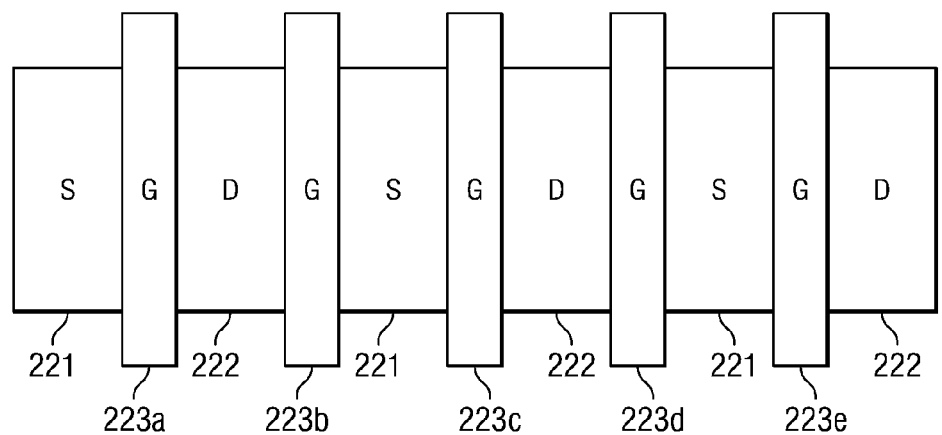
FIG. 2B illustrates an example segmented gate of a transistor.

In particular embodiments, the difference between binary-weighted DAC 200a and amplitude-phase component 100 is that with binary-weighted DAC 200a, the gates of each pair of transistors are segmented, grouped in a binary weighted fashion and controlled by separate phase bits while keeping the sources and drains connected together. A transistor has a source, a drain, and a gate. In particular embodiments, the gate of each of the transistors in binary-weighted DAC 200a, e.g., transistors 211a-211d, is segmented with the source and the drain of the transistor alternatingly interspersed among the segments of the gate. FIG. 2B illustrates an example segmented gate of a transistor, e.g., transistor 211a. The gates of the other transistors in binary-weighted DAC 200a are similarly segmented. In particular embodiments, the gate of transistor 211a is segmented into five parts 223a, 223b, 223c, 223d, 223e. Source 221 and drain 222 of transistor 211a are alternatingly interspersed between segments 223a-223e of the gate.

There are three pairs of transistors illustrated in binary-weighted DAC 200a: transistors 211a and 211b, transistors 211c and 211d, and transistors 211e and 211f, each may be considered a differential pair of transistors. In particular embodiments, for each differential pair of transistors, their gates are segmented and grouped together. Thus, the segments of the gate of transistor 211a and the segments of the gate of transistor 211d may be grouped together; and the segments of the gate of transistor 211c and the segments of the gate of transistor 211b may be grouped together. In particular embodiments, the source of transistor 211a and the source of transistor 211b are connected together, and the source of transistor 211c and the source of transistor 211d are connected together. The drain of transistor 211a and the drain of transistor 211c are connected together, and the drain of transistor 211b and the drain of transistor 211d are connected together.

In particular embodiments, binary-weighted DAC 200 may contain n binary-weighted Gilbert cell multipliers with $1, 2, \ldots, 2^{n-1}$ gates. Each of transistors 211a-211f may be a metal-oxide-semiconductor field-effect transistor (MOSFET). Transistors 211a-211d are binary-weighted gate fingers and may be switched from 0 to 0.3 mA/μm. Transistors 211e and 211f may be biased at 0.3 mA/μm. The voltage gain for binary-weighted DAC 200 may be expressed as:

$$V_{OUT} = g'_m W_f Z_L V_{IN} \sum_{i=0}^{i=n-1} (-1)^{b_i} 2^i \qquad (1A)$$

where $g'_m$ denotes the MOSFET transconductance per unit gate width; $W_f$ denotes the finger width; and $b_i$ equals 0 or 1.

In particular embodiments, the approach as illustrated with binary-weighted DAC 200 contributes little additional layout parasitics at the high frequency nodes and thus allows for digital control voltages to be applied directly to the individual gate fingers of the MOSFETs, of MOSFET differential pairs, or of MOSFET Gilbert cells. In this unique-to-complementary metal-oxide-semiconductor (CMOS) technique, every mm-wave circuit becomes a segmented or binary-weighted mm-wave DAC. MOSFET channel slices biased at the optimal operating point, e.g., minimum noise figure bias current density in low noise amplifiers (LNAs) and peak linearity bias in power amplifiers (PAs), may either be turned on or off.

Figure 2C:
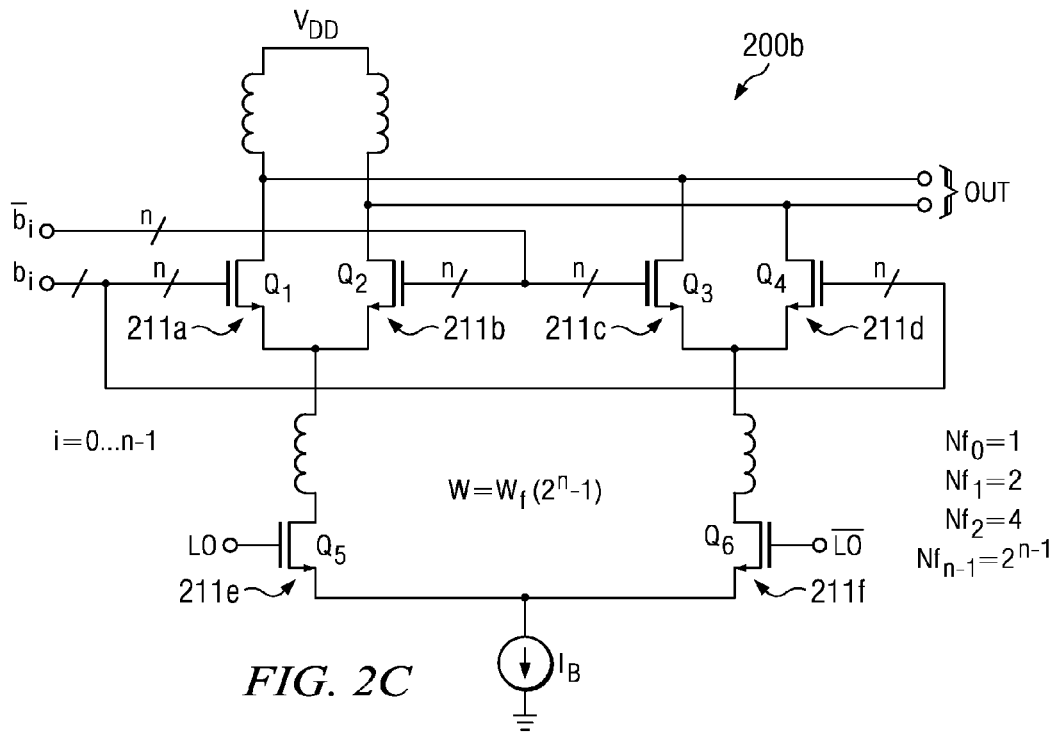
FIG. 2C illustrates an example binary-weighted where the input signal is local oscillator (LO) signal.

In particular embodiments, the input signal to binary-weighted DAC 200 may be LOC signal. FIG. 2C illustrates a binary-weighted DAC 200b having LO signal as the input signal. Again, transistors 211a-211d are binary-weighted gate fingers and may be switched from 0 to 0.3 mA/μm. Transistors 211e and 211f may be biased at 0.3 mA/μm. In this particular case, the voltage gain for binary-weighted DAC 200a may be expressed as:

$$V_{OUT} = g'_m W_f Z_L V_{LO} \sum_{i=0}^{i=n-1} (-1)^{b_i} 2^i \qquad (1B)$$

In particular embodiments, a 16-QAM modulator may be constructed using two pairs (note that each amplitude-phase component simplifies to a BPSK modulator but particular embodiments need a pair driven in quadrature to form a QPSK modulator and 16 QAM modulator) of the amplitude-phase components, e.g., four amplitude-phase components 100 driven by a quadrature input signal. As described above, each of the amplitude-phase components has an amplitude-control bit, a phase-control bit, a signal input for receiving input signals, each of which having an amplitude, a frequency, and a phase, and a signal output for transmitting output signals, each of which having an amplitude, a frequency, and a phase. An output signal of the amplitude-phase component is produced based on an input signal and the values of the amplitude-control bit and the phase-control bit.

The two pairs of amplitude-phase components are driven by quadrature input signals, connected in parallel at the output, and binary scaled such that the scale ratio between the two pairs of amplitude-phase components is approximately or precisely 1:2. Particular embodiments measure the scale ratio between the two different pairs of amplitude-phase components based on the physical sizes of the two different amplitude-phase components, such that the physical size of the second pair of amplitude-phase components is approximately or precisely twice as the physical size of the first pair of amplitude-phase components, resulting the scale ratio between the physical sizes of the two pairs of amplitude-phase components as approximately or precisely 1:2. Particular embodiments measure the scale ratio between the two pairs of amplitude-phase components based on the amplitudes of the output signals of the two pairs of amplitude-phase components, such that the amplitude of the output signal of the second pair of amplitude-phase components is approximately or precisely twice as the amplitude of the output signal of the first pair of amplitude-phase components, resulting the scale ratio between the amplitudes of the output signals of the two pairs of amplitude-phase components as approximately or precisely 1:2.

The output signals of the two pairs of amplitude-phase components may be sent to a combiner to be combined into an output signal for the 16-QAM modulator. In particular embodiments, the smaller, first pair of amplitude-phase component remains turned on while the 16-QAM modulator is in operation so that the combiner continuously receives an output signal from the first pair of amplitude-phase components. The larger, second pair of amplitude-phase components may be turned on or off while the 16-QAM modulator is in operation depending on the application requirements of the 16-QAM modulator. The second pair of amplitude-phase components transmits an output signal to the combiner only when it is turned on. Thus, the combiner may or may not receive an output signal from the second pair of amplitude-phase component. More specifically, the combiner does not receive any output signal from the second pair of amplitude-phase components while the second pair of amplitude-phase components is turned off. When producing the output signal for the 16-QAM modulator, if the combiner receives two output signals from both pairs of amplitude-phase components, the two output signals are combined to produce the output signal of the 16-QAM modulator; on the other hand, if the combiner only receives one output signal from one of the pairs of amplitude-phase components, e.g., the smaller, first pair of amplitude-phase components, the output signal from the first pair of amplitude-phase components becomes the output signal of the 16-QAM modulator.

Particular embodiments provide various ways to turn the larger, second pair of amplitude-phase components on and off as desired. For example, recall that when the amplitude-control bit is 0, the amplitude of the output signal of an amplitude-phase component represents binary 0, and particular embodiments use 0 amplitude to represent binary 0. An output signal having a 0 amplitude is equivalent to no signal. Thus, to turn off the second pair of amplitude-phase components, both of its amplitude-control bits must be set to 0, causing its output signal to have a 0 amplitude. Conversely, to turn on the second pair of amplitude-phase components at least one of its amplitude-control bits may be set to 1, causing its output signal to have a non-zero amplitude, e.g., the amplitude of its input signal. When the combiner receives a non-zero-amplitude output signal from the first pair of amplitude-phase components and a zero-amplitude output signal from the second pair of amplitude-phase components, the combined output signal for the 16-QAM modulator is in fact the same as the non-zero-amplitude output signal from the first pair of amplitude-phase components. When the combiner receives a non-zero-amplitude output signal from the first pair of amplitude-phase components and a non-zero-amplitude output signal from the second pair of amplitude-phase components, the combined output signal for the 16-QAM modulator is the sum of the two non-zero-amplitude output signals from the first and the second pairs of amplitude-phase components.

Figure 3A:
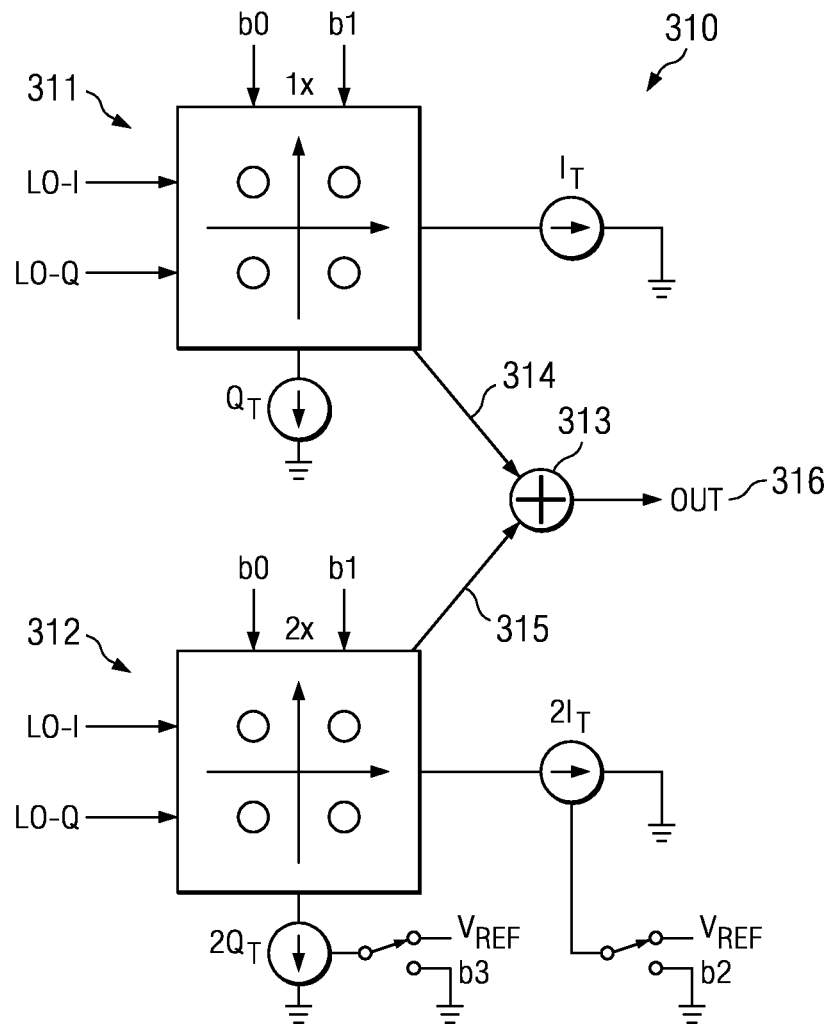
FIG. 3A illustrates an example 16-QAM modulator formed with two binary scaled QPSK modulators.
Figure 3B:
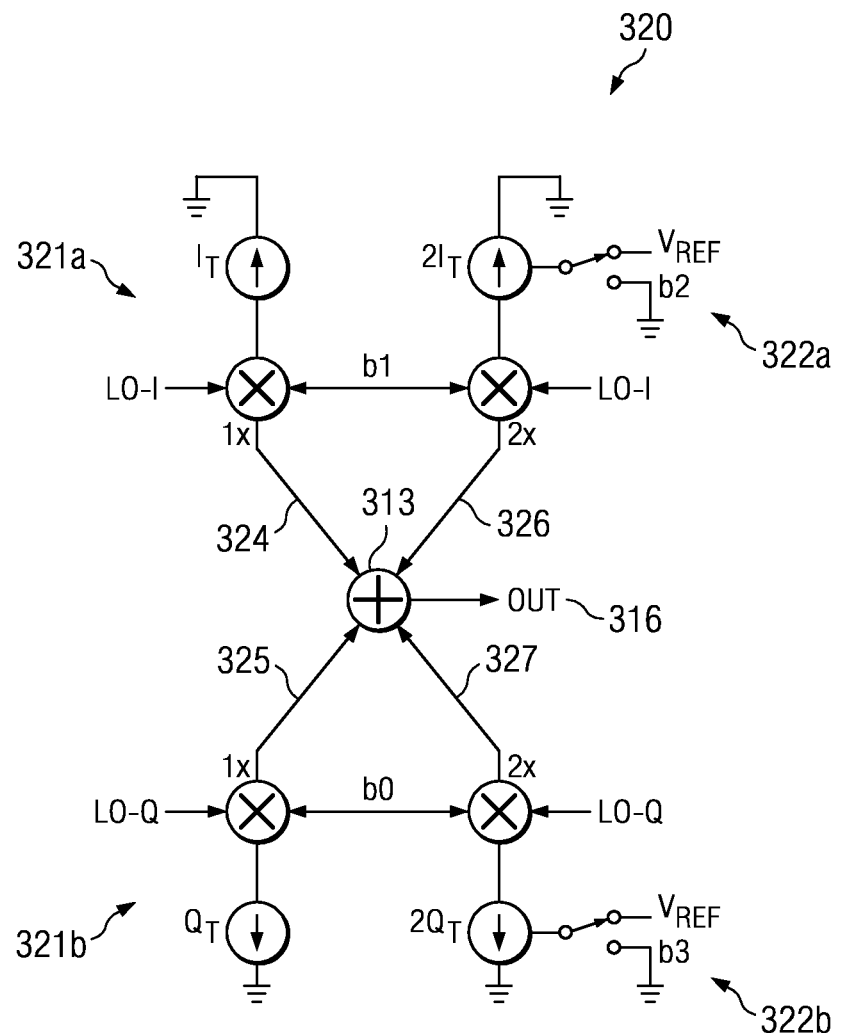
FIG. 3B illustrates an example 16-QAM modulator formed with four binary scaled BPSK modulators.

In particular embodiments, each of the two pairs of amplitude-phase components contained in the 16-QAM modulator may be a QPSK modulator or two identical BPSK modulators. Thus, the 16-QAM modulator may be formed with two QPSK modulators or four BPSK modulators. FIG. 3A illustrates an example 16-QAM modulator 310 constructed using two binary scaled QPSK modulators 310a and 310b, and FIG. 3B illustrates an example 16-QAM modulator 320 constructed using four binary scaled BPSK modulators 321a-322b. In FIGS. 3A-3B, the input signals are illustrated as LO signals, with I representing the in-phase component and Q representing the quadrature component of the LO signals.

In FIG. 3A, QPSK modulators 311 and 312 are connected in parallel. The scale ratio between QPSK modulators 311 and 312 is approximately or precisely 1:2. b2 and b3 represent the amplitude-control bit; b0 and b1 represent the phase-control bit; and LO-I and LO-Q represent the quadrature input signals. The output signal 314 from QPSK modulator 311 and the output signal 315 from QPSK modulator 312 are transmitted to a combiner 313 to be combined to produce the output signal 316 for 16-QAM modulator 310.

QPSK modulator 311 remains turned on while 16-QAM modulator 310 is in operation so that combiner 313 continuously receives output signal 314 from QPSK modulator 311. QPSK modulator 312 may be turned on or off while 16-QAM modulator 310 is in operation depending on the application requirements of 16-QAM modulator 310. QPSK modulator 312 transmits output signal 315 to combiner 313 only when it is turned on.

In FIG. 3B, BPSK modulators 321a, 321b, 322a, and 322b are connected in parallel. From a functional point of view, two BPSK modulators, driven by quadrature input signals and whose outputs are connected in parallel, are functionally equivalent to one QPSK modulator. Thus, BPSK modulators 321a and 321b together are functionally equivalent to QPSK modulator 311, and BPSK modulators 322a and 322b together are functionally equivalent to QPSK modulator 312. In particular embodiments, BPSK modulators 321a and 321b are identical, and BPSK modulators 322a and 322b are identical. The scale ratio between BPSK modulators 321a and 322a is approximately or precisely 1:2; and similarly, the scale ratio between BPSK modulators 321b and 322b is approximately or precisely 1:2.

Again, b2 and b3 represent the amplitude-control bit; b0 and b1 represent the phase-control bit; and LO-I and LO-Q represent the quadrature input signals. The output signal 324 from BPSK modulator 321a, the output signal 325 from BPSK modulator 321b, the output signal 326 from BPSK modulator 322a, and the output signal 327 from BPSK modulator 322b are transmitted to a combiner 313 to be combined to produce the output signal 316 for 16-QAM modulator 320.

In particular embodiments, BPSK modulators 321a and 321b remain turned on while 16-QAM modulator 320 is in operation so that combiner 313 continuously receives output signals 324 and 325 from BPSK modulators 321a and 321b. BPSK modulators 322a and 322b may be turned on or off while 16-QAM modulator 320 is in operation depending on the application requirements of 16-QAM modulator 320. BPSK modulators 322a and 322b transmit output signals 326 and 327 to combiner 313 only when they are turned on.

In particular embodiments, a 64-QAM modulator may be formed with three pairs of the amplitude-phase components, e.g., six amplitude-phase components 100. Again, each of the amplitude-phase components has an amplitude-control bit, a phase-control bit, a signal input for receiving input signals, each of which having an amplitude, a frequency, and a phase, and a signal output for transmitting output signals, each of which having an amplitude, a frequency, and a phase. An output signal of the amplitude-phase component is produced based on an input signal and the values of the amplitude-control bit and the phase-control bit.

The three pairs of amplitude-phase components are connected in parallel and binary scaled such that the scale ratio between the three different amplitude-phase components is approximately or precisely 1:2:4. Particular embodiments measure the scale ratio between the three pairs of amplitude-phase components based on the physical sizes of the three different amplitude-phase components, such that the physical size of the third pair of amplitude-phase components is approximately or precisely twice as the physical size of the second pair of amplitude-phase components and the physical size of the second pair of amplitude-phase components is approximately or precisely twice as the physical size of the first pair of amplitude-phase components, resulting the scale ratio between the physical sizes of the three pairs of amplitude-phase components as approximately or precisely 1:2:4. Particular embodiments measure the scale ratio between the three pairs of amplitude-phase components based on the amplitudes of the output signals of the three pairs of amplitude-phase components, such that the amplitude of the output signal of the third pair of amplitude-phase components is approximately or precisely twice as the amplitude of the output signal of the second pair of amplitude-phase components and the amplitude of the output signal of the second pair of amplitude-phase components is approximately or precisely twice as the amplitude of the output signal of the first pair of amplitude-phase components, resulting the scale ratio between the amplitudes of the output signals of the three pairs of amplitude-phase components as approximately or precisely 1:2:4.

The output signals of the three pairs of amplitude-phase components may be sent to a combiner to be combined into an output signal for the 64-QAM modulator. In particular embodiments, the smallest, first pair of amplitude-phase components remains turned on while the 64-QAM modulator is in operation so that the combiner continuously receives an output signal from the first pair of amplitude-phase components. The larger, second and third pairs of amplitude-phase components may be independently turned on or off while the 64-QAM modulator is in operation depending on the application requirements of the 64-QAM modulator. The second and third pairs of amplitude-phase components transmit output signals to the combiner only when they are turned on. Thus, the combiner may or may not receive an output signal from the second pair of amplitude-phase components or the third pair of amplitude-phase components. More specifically, the combiner does not receive any output signal from the second pair of amplitude-phase components or the third pair of amplitude-phase components while the second amplitude-phase component or the third amplitude-phase component are turned off. When producing the output signal for the 64-QAM modulator, if the combiner receives three output signals from all three pairs of amplitude-phase components, the three output signals are combined to produce the output signal of the 64-QAM modulator. If the combiner receives two output signals from only two pairs of the three pairs of amplitude-phase components, e.g., the first and second pairs of amplitude-phase components or the first and third pairs of amplitude-phase components, the two output signals are combined to produce the output signal of the 64-QAM modulator. If the combiner only receives one output signal from one of the three pairs of amplitude-phase components, e.g., the smallest, first pair of amplitude-phase components, the output signal from the first pair of amplitude-phase components becomes the output signal of the 64-QAM modulator.

Particular embodiments provide various ways to independently turn on and off the larger, second and third pairs of amplitude-phase components. For example, the second and third pairs of amplitude-phase components may be independently turned on and off similarly as described above with respect to the 16-QAM modulator.

Figure 4:
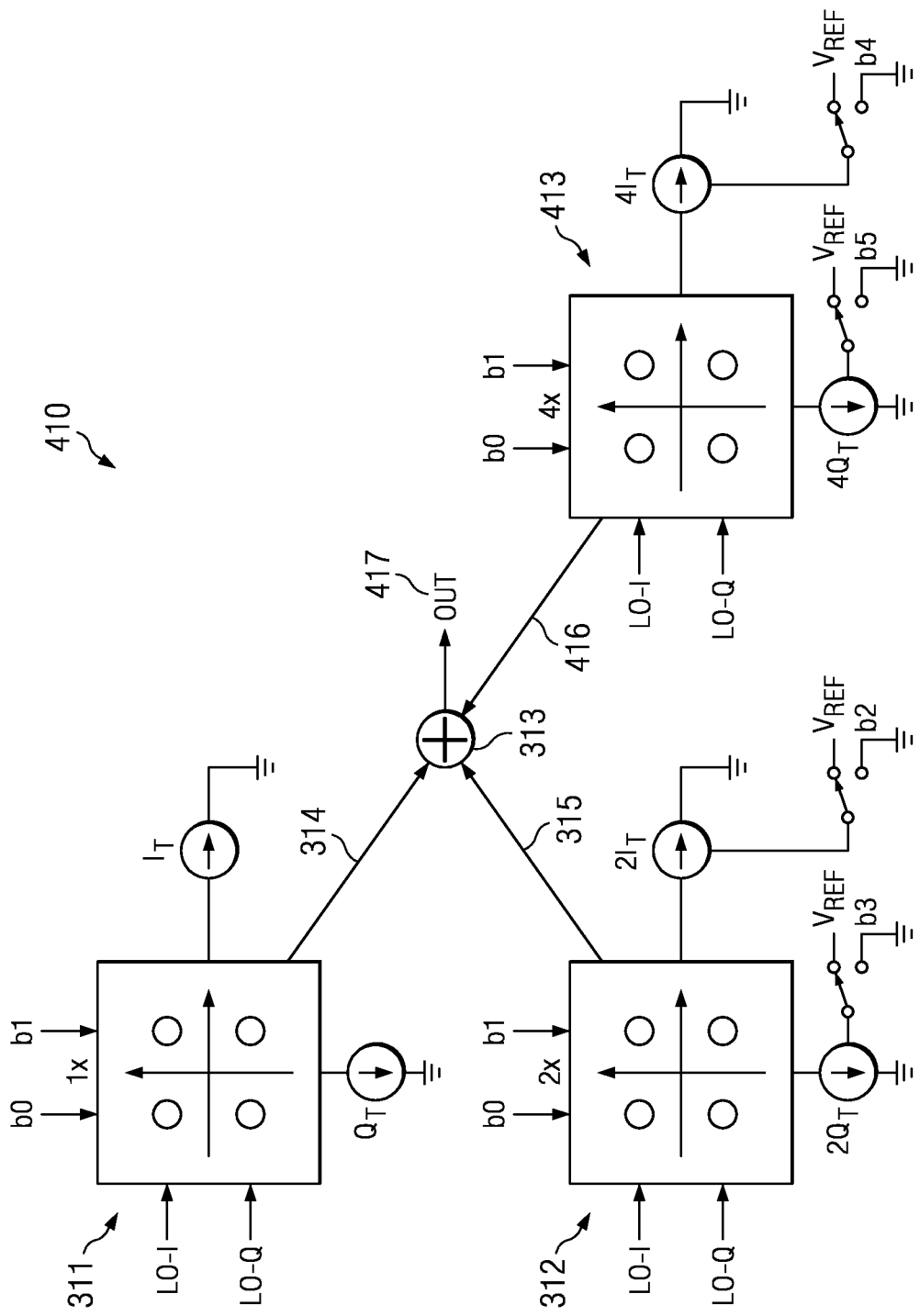
FIG. 4 illustrates an example 64-QAM modulator formed with three binary scaled QPSK modulators.

In particular embodiments, each of the three pairs of amplitude-phase components may be a QPSK modulator or two identical BPSK modulators. Thus, the 64-QAM modulator may be formed with three QPSK modulators or six BPSK modulators. FIG. 4 illustrates an example 64-QAM modulator 410 formed with three binary scaled QPSK modulators 311, 312, 413. In FIG. 4, the input signals are illustrated as LO signals, with I representing the in-phase component and Q representing the quadrature component of the LO signals.

QPSK modulators 311, 312, and 413 are connected in parallel. The scale ratio between QPSK modulators 311, 312, and 413 is approximately or precisely 1:2:4. b2, b3, b4, and b5 represent the amplitude-control bits; b0 and b1 represent the phase-control bits; and LO-I and LO-Q represent the quadrature input signals. The output signal 314 from QPSK modulator 311, the output signal 315 from QPSK modulator 312, and the output signal 416 from QPSK modulator 413 are transmitted to a combiner 313 to be combined to produce the output signal 417 for 64-QAM modulator 410.

QPSK modulator 311 remains turned on while 64-QAM modulator 410 is in operation so that combiner 313 continuously receives output signal 314 from QPSK modulator 311. QPSK modulators 312 and 413 may be independently turned on or off while 64-QAM modulator 410 is in operation depending on the application requirements of 64-QAM modulator 410. QPSK modulators 312 413 transmit output signals 315 and 416 to combiner 313 respectively only when they are turned on.

The pairs of amplitude-phase components forming the 16-QAM and 64-QAM modulators are binary scaled. As explained above, for the 16-QAM modulator, the scale ratio between the two pairs of amplitude-phase components is approximately or precisely 1:2, and for the 64-QAM modulator, the scale ratio between the three pairs of amplitude-phase components is approximately or precisely 1:2:4. To achieve the binary scale between the pairs of amplitude-phase components, particular embodiments use identical QPSK modulators, such that the larger-scale pairs of amplitude-phase components are formed with greater numbers of QPSK modulators. More specifically, with the 16-QAM modulator, three identical QPSK modulators may be used: the smaller, first pair of amplitude-phase components being formed with one of the three QPSK modulators and the larger, second pair of amplitude-phase components being formed with the other two of the three QPSK modulators, thus ensuring that the scale ratio between the physical sizes of the first pair of amplitude-phase components and the second pair of amplitude-phase components is 1:2. With the 64-QAM modulator, seven identical QPSK modulators may be used: the smallest, first pair of amplitude-phase components being formed with one of the seven QPSK modulators, the middle-sized, second pair of amplitude-phase components being formed with another two of the seven QPSK modulators, and the largest, third pair of amplitude-phase component being formed with the remaining four of the seven QPSK modulators, thus ensuring that the scale ratio between the physical sizes of the first pair of amplitude-phase components, the second pair of amplitude-phase component, and the third pair of amplitude-phase component is 1:2:4.

The above modulator topologies may also be applied to BPSK modulators. Particular embodiments replace each of the QPSK modulators used in the above modulator topologies with two identical BPSK modulators.

Figure 5:
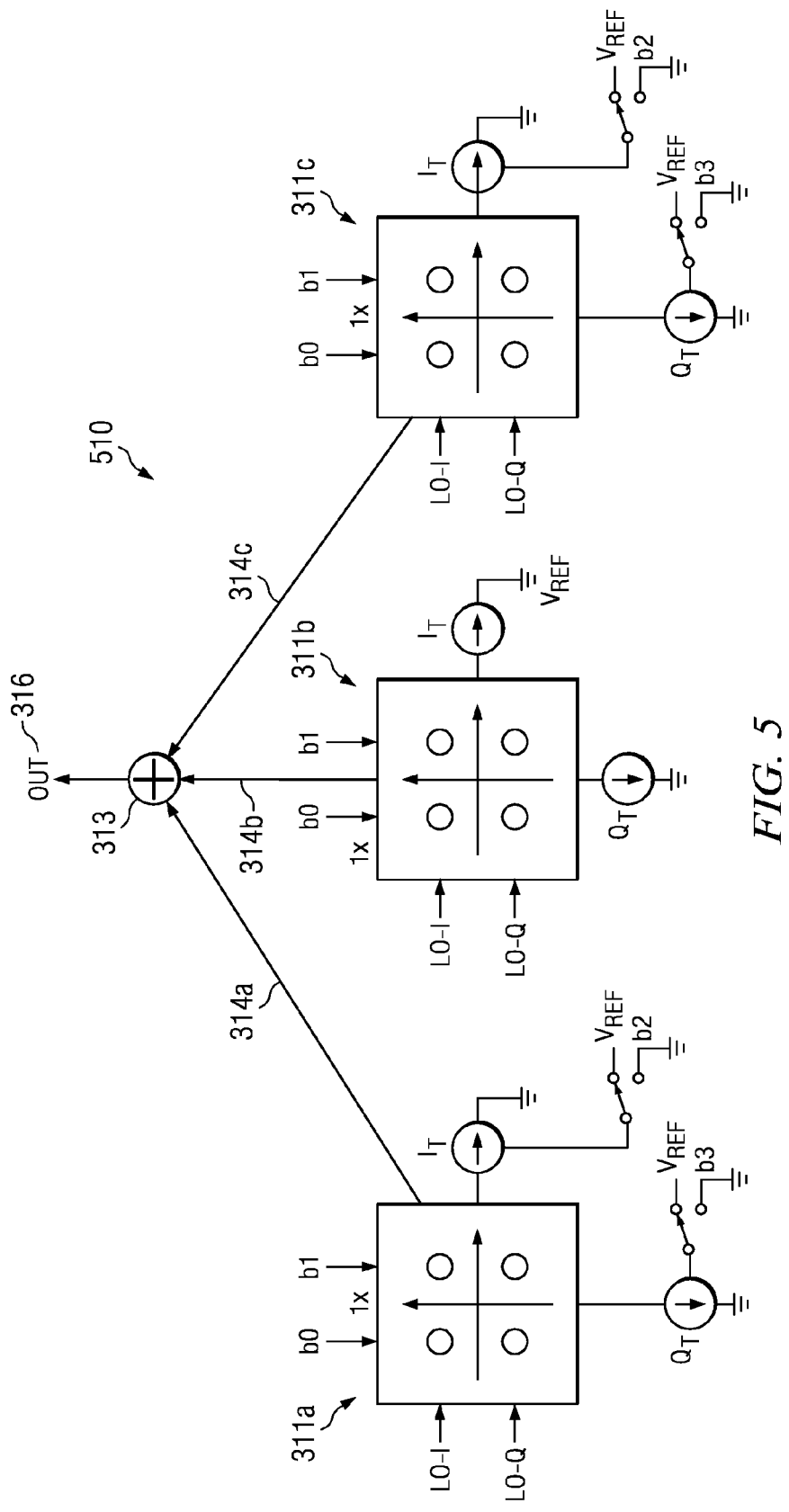
FIG. 5 illustrates an example 16-QAM modulator formed with three identical QPSK modulators.

FIG. 5 illustrates an example 16-QAM modulator 510 constructed using three identical QPSK modulators, e.g., QPSK modulator 311 as illustrated in FIG. 3A. In FIG. 5, the input signals are illustrated as LO signals, with I representing the in-phase component and Q representing the quadrature component of the LO signals. The three QPSK modulator, 311a, 311b, and 311c, are connected in parallel. The first of the three QPSK modulators, 311a, is functionally equivalent to the smaller, first pair of amplitude-phase components included in a 16-QAM modulator, and the second and third of the three QPSK modulators, 311b and 311c, together are functionally equivalent to the larger, second pair of amplitude-phase components included in the 16-QAM modulator.

Similar to FIG. 3A, b2 and b3 represent the amplitude-control bit; b0 and b1 represent the phase-control bit; and LO-I and LO-Q represent the input signal. The output signal 314a from QPSK modulator 311a, the output signal 314b from QPSK modulator 311b, and the output signal 314c from QPSK modulator 311c are transmitted to a combiner 313 to be combined to produce the output signal 316 for 16-QAM modulator 510.

One of the three QPSK modulators, e.g., QPSK modulator 311a, remains turned on while 16-QAM modulator 510 is in operation so that combiner 313 continuously receives at least one output signal 314a from at least QPSK modulator 311a. The other two of the three QPSK modulators, e.g., QPSK modulators 311b and 311c, may be turned on or off while 16-QAM modulator 510 is in operation depending on the application requirements of 16-QAM modulator 310. The other two QPSK modulators, e.g., QPSK modulators 311b and 311c, transmit the other two output signals, e.g., output signals 314b and 314c, to combiner 313 only when they are turned on.

In particular embodiments, one of the three QPSK modulators, e.g., QPSK modulator 311a, may be biased at a constant tail current of 0.3 mA/μm, while the other two of the three QPSK modulators, e.g., QPSK modulators 311b and 311c, may be switched between 0 and 0.3 mA/μm by the two amplitude-control bits b2 and b3. Assuming perfectly matched layouts, the voltage of output signal 316 of 16-QAM modulator 510 becomes:

$$V_{OUT}=(-1)^{b_0}g_m R_L(1+2b_2)V_1 \cos(\omega t)-(-1)^{b_1}g_m R_L(1+2b_3)(V_1+\delta\phi)\sin(\omega t+\delta\phi) \quad (2)$$

where $g_m$ denotes the transconductance of the transconductor in each of the six BPSK cells with two BPSK cells for each QPSK cell, $R_L$ denotes the load resistance of the 16-QAM modulator, e.g., 16-QAM modulator 510, and $b_i$ equals 0 or 1. $V_I$ and $V_Q=V_I+\delta V$ are the amplitude of the LO signal at the I and Q inputs of the 16-QAM modulator, respectively. $\delta V$ denotes amplitude imbalance and $\delta\phi$ denotes the phase imbalance of the quadrature LO signals.

In general, a digitally modulated M-PSK signal has M phase states and can be defined as:

$$s_1(t)=A\cos(\omega t+\phi_i) \quad (3)$$

where $$\phi_i = 2\pi \frac{i}{M} \text{ for } i = 0, 1, 2, \ldots, M-1, M = 2^n$$

and n represents the number of bits per symbol. M-BPSK modulation corresponds to M=2 and n=1, while QPSK modulation is described by M=4 and n=2.

M-ary phase modulation has constant amplitude and does not require very linear power amplifiers to boost the modulated carrier. The M phase states may be represented with phases, with its x-axis projection describing the in-phase (I) component and its y-axis projection representing the quadrature component (Q). The expression of a QPSK-modulated signal may therefore be recast as:

$$s(t)=a_I\cos(\omega t)-b_Q\sin(\omega t) \quad (4)$$

where $a_I$ and $b_Q$ are either 1 or −1.

The M-ary PSK modulation may be generalized to M-ary QAM modulation by allowing the amplitudes of the I and Q components to vary, as:

$$s_k(t)=a_k\cos(\omega t)-b_k\sin(\omega t) \quad (5)$$

For a 16-QAM signal, $$(a_k, b_k) = (+/-1, +/-1), \left(+/-\frac{1}{3}, +/-\frac{1}{3}\right),$$
$$\left(+/-1, +/-\frac{1}{3}\right), \left(+/-\frac{1}{3}, +/-1\right)$$

and may be described mathematically as a function of the data bits $b_0$, $b_1$, $b_2$, and $b_3$ as:

$$(a_k, b_k) = \left((-1)^{b_0}\frac{1+2b_2}{3}, (-1)^{b_1}\frac{1+2b_3}{3}\right) \quad (6)$$

For a 64-QAM signal, $$(a_k, b_k) = (+/-1, +/-1), \left(+/-\frac{5}{7}, +/-\frac{5}{7}\right), \left(+/-\frac{3}{7}, +/-\frac{3}{7}\right),$$
$$\left(+/-\frac{1}{7}, +/-\frac{1}{7}\right), \left(+/-1, +/-\frac{5}{7}\right), \left(+/-\frac{5}{7}, +/-1\right),$$
$$\left(+/-1, +/-\frac{3}{7}\right), \left(+/-\frac{3}{7}, +/-1\right), \left(+/-1, +/-\frac{1}{7}\right), \left(+/-\frac{1}{7}, +/-1\right),$$
$$\left(+/-\frac{5}{7}, +/-\frac{3}{7}\right), \left(+/-\frac{3}{7}, +/-\frac{5}{7}\right), \left(+/-\frac{5}{7}, +/-\frac{1}{7}\right),$$
$$\left(+/-\frac{1}{7}, +/-\frac{5}{7}\right), \left(+/-\frac{3}{7}, +/-\frac{1}{7}\right), \left(+/-\frac{1}{7}, +/-\frac{3}{7}\right)$$

Mathematically, the 64-QAM IQ amplitudes may be described as a function of the data bits $b_0$, $b_1$, $b_2$, $b_3$, $b_4$, and $b_5$ as:

$$(a_k, b_k) = \left((-1)^{b_0}\frac{1+2b_2+4b_4}{7}, (-1)^{b_1}\frac{1+2b_3+4b_5}{7}\right) \quad (7)$$

In each case, the I and Q signal amplitude states are normalized to the maximum amplitude. Consequently, all M-ary PSK and QAM modulators with M≥4 may be realized with a 90° phase shifter and a digital amplitude modulator. The latter may be either a switch or a set of switches, as in a Gilbert-cell mixer.

From Equations (2) and (5), the expression of $a_k$ and $b_k$ may be found as:

$$a_k = (-1)^{b_0} g_m R_L (1+2b_2) V_I \quad (8)$$

$$b_k = (-1)^{b_1} g_m R_L (1+2b_3) V_I \quad (9)$$

Equations (8) and (9) illustrate two characteristics of the 16-QAM and 64-QAM modulator topologies described in the present disclosure: (1) the nonlinear terms $g_m$ and $V_I$ are common to all $a_k$ and $b_k$, and thus will cancel out when the amplitudes of the 16 states are ratio-ed and will not lead to EVM degradation, at least to a first order; and (2) the output voltage and power of the modulator may be controlled by adjusting the amplitude of the input LO signal $V_I$.

In particular embodiments of the 16-QAM and 64-QAM modulators, the modulator topology relies on the perfect matching of the layouts of the three identical QPSK modulators, as illustrated in FIG. 5. No matter how non-linear the three QPSK modulators are, as long as their nonlinearities are identical and as long as the amplitude of the signal on the load inductors does not exceed the $V_{DS}$ of the mixing quad transistors, their currents add linearly and the amplitude ratio may be precisely 3:1. Furthermore, the multi-bit DACs are replaced by the 1-bit DACs, which are infinitely linear. Particular embodiments convert the non-linearity problem that plagues nano-scale CMOS technology to a problem of layout geometry, component matching, e.g., MOSFET and transformer, and balanced quadrature signal generation.

In particular embodiments of the 16-QAM and 64-QAM modulators, a first data bit is applied to the mixing quad and a second data bit switches the tail current source, thus simultaneously modulating the phase and the amplitude of the carrier wave. Particular embodiments of the 16-QAM and 64-QAM modulator may also describe the unit cell in the 16-QAM and 64-QAM modulators, e.g., the amplitude-phase component, as a 2-bit, phase and amplitude modulated mm-wave DAC. In particular embodiments, the 16-QAM modulator may act as a switching power amplifier, such that power back-off is no longer necessary to maintain linearity. In particular embodiments of the 16-QAM modulator, a transformer-coupled cascade topology may be employed to maximize the output voltage swing and output power at low supply voltages.

Figure 6:
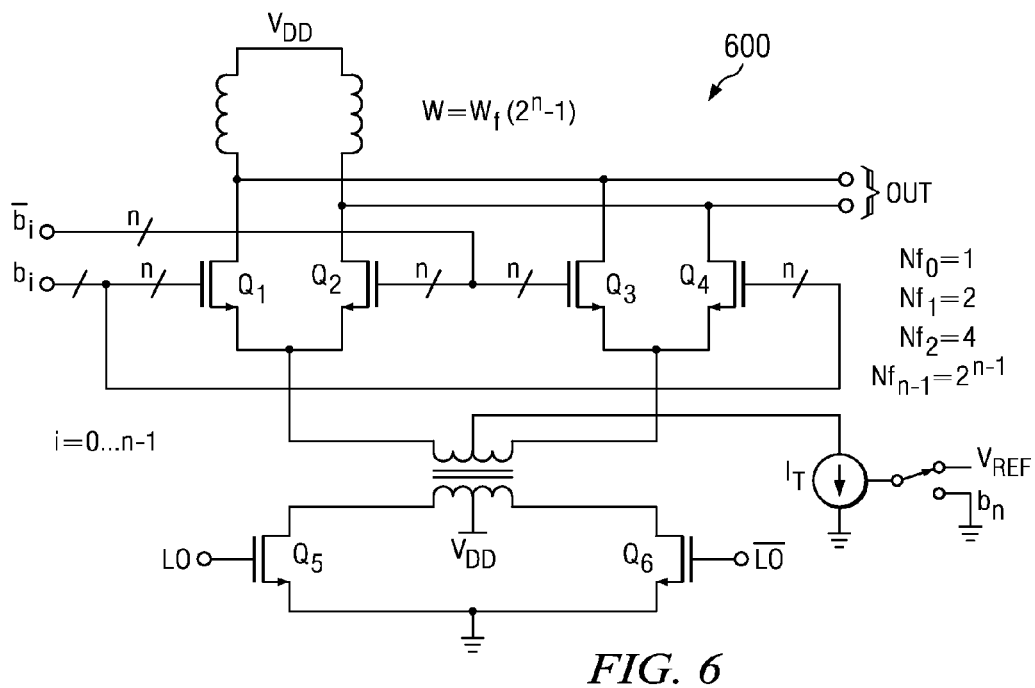
FIG. 6 illustrates an example 2-bit amplitude and phase modulator and n-bit DAC unit.

FIG. 6 illustrates an example 2-bit amplitude and phase modulator and n-bit DAC unit 600. In this particular embodiment, for operation as a 2-bit amplitude and phase modulator, $b_0 = b_1 = b_{n-1}$ and $b_n = (0, 1)$. For operation as a n-bit DAC, $b_n = 1$. In addition, $I_T = 12$ mA, $N_f = 21$, and $W_f = 0.91$ µm.

Phase shifters are important components in phase array radar, radio transceivers, and imaging transceivers where they perform electronic beam-steering and beam-steering and beam-forming functions. They may also be employed to correct the amplitude and phase imbalance between the quadrature paths of a clock/LO distribution network in transmitters and receivers. With the emergence of new wireless high definition video standards for consumer electronics at 60 GHz that mandate non-line-of-site (NLOS) operation, it is desirable to integrate them in low-cost silicon technologies.

Figure 7:
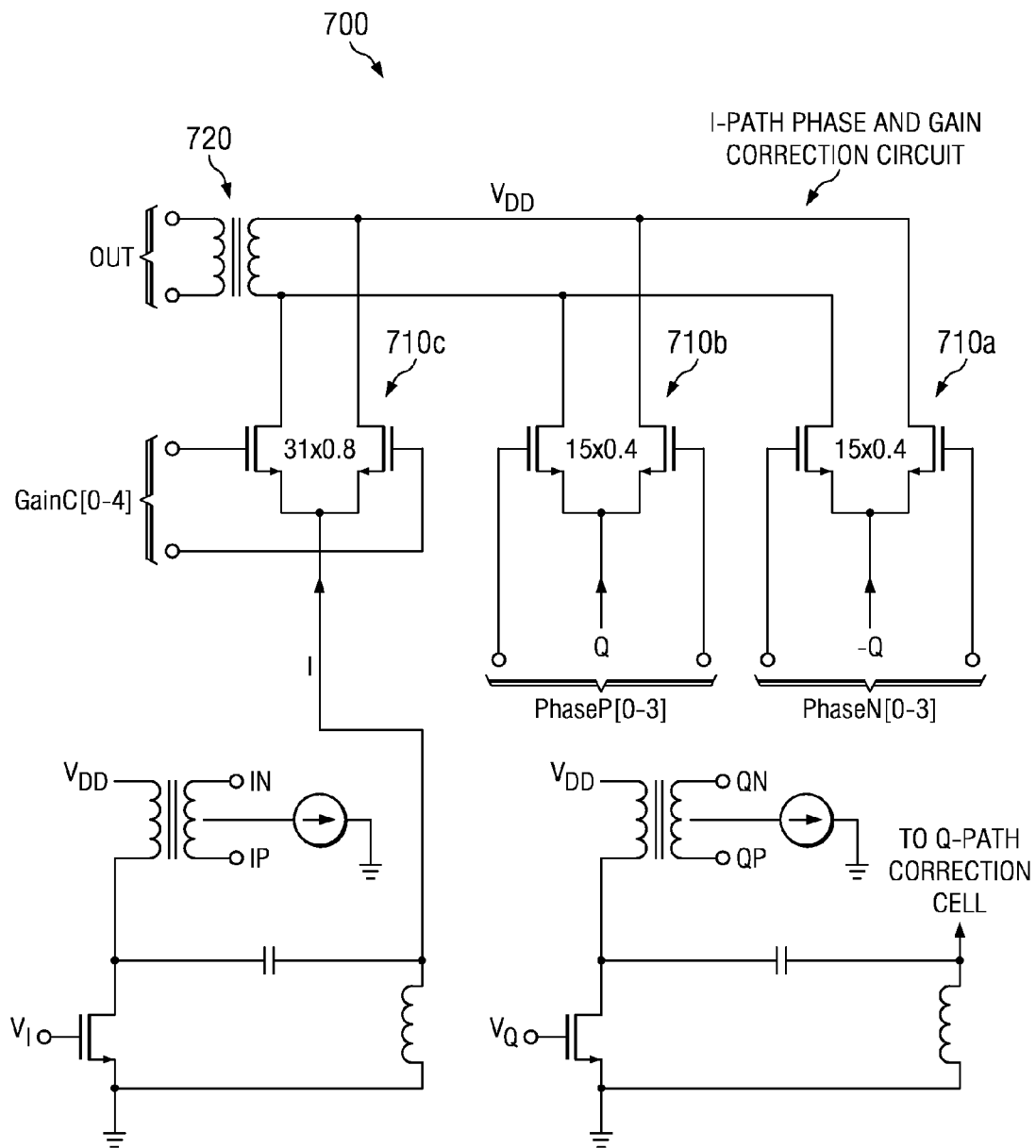
FIG. 7 illustrates an example amplitude and phase correction circuit.

In general, a phase shifter is a two-port device whose function is to alter the phase of a RF signal without introducing a parasitic amplitude variation. For semiconductor phase shifters, there are analog and digital phase shifters depending on whether the phase control element is implemented with a continuously variable reactance or with a switch. FIG. 7 illustrates an example LO-path amplitude and phase correction circuit 700 needed to ensure that the quadrature input signals to the modulator are perfectly balanced and precisely 90° out of phase. The Q and –Q currents are obtained from the Q-path of the LO distribution network. Circuit 700 includes a single-ended AC-coupled cascade topology. The capacitors and transformers are coupled to the main and secondary paths. The phase correction range is ±15° with 1° precision, and the gain correction range is ±5 dB. The output voltage, amplitude, and phase of circuit 700 may be respectively defined as:

$$V_{OUT} = g'_m W_f Z_L V_{IN} \left[ \cos(\omega t) \sum_{i=0}^{4} g_i 2^i + j \frac{\sin(\omega t)}{2} (1 - 2p_4) \sum_{i=0}^{3} p_i 2^i \right] \quad (10)$$

$$|A_V|^2 = (g'_m W_f Z_L)^2 \left[ \left( \sum_{i=0}^{4} g_i 2^i \right)^2 + \frac{(1-2p_4)^2}{4} \left( \sum_{i=0}^{3} p_i 2^i \right)^2 \right] \quad (11)$$

$$\pm 1 < \phi = \tan^{-1} \left[ \frac{(1-2p_4) \sum_{i=0}^{3} p_i 2^i}{2 \sum_{i=0}^{4} g_i 2^i} \right] < \pm 15 \quad (12)$$

Circuit 700 allows for gain as well as positive and negative phase control. It employs three binary-weighted amplifiers 710a-710c that independently adjust the amplitude and the phase of the input signal as required for correcting the amplitude and phase imbalance of quadrature LO and clock distribution networks. As illustrated, three common-gate differential pairs 710a-710c are employed in the I-path of the LO distribution network to add the in-phase (I) and the positive (Q) and negative (–Q) quadrature currents on the primary-coil of an output transformer 720. One of the drain terminals of each differential pair 710a-710c is connected to the primary of output transformer 720, which acts as a mm-wave current summer. The other drain of each differential pair 710a-710c is connected to $V_{DD}$. The three mm-wave currents—I, Q, and –Q—are fed separately to the common source node of one of the three differential pairs, one current per differential pair. The primary coil of the transformer adds the output currents from the three differential pairs as $I_{OUT} = I_1 + I_2 + I_3$ and converts the signal to a voltage. The secondary coil of the transformer provides a differential voltage to the next stage.

In particular embodiments, by controlling the number of activated gate fingers in each differential pair 710a-710c, the three output currents may be weighted before they are summed up in the transformer. In particular embodiments, in order to allow for both positive and negative phase correction, one of $I_2$ or $I_3$ must be zero at any given time. The amplitude and phase of the output current may be respectively calculated as:

$$I_{OUT} = \sqrt{I_1^2 + I_2^2} \text{ or } I_{OUT} = \sqrt{I_1^2 + I_3^2} \quad (12)$$

$$\phi = \arctan\left(\frac{I_2}{I_1}\right) \text{ or } \phi = \arctan\left(\frac{I_3}{I_1}\right) \quad (13)$$

In circuit 700, multi-bit differential control voltages G[0 . . . n], PhaseP[0 . . . p], PhaseN[0 . . . p] are applied to the gates of the differential pairs, respectively, where n+1 is the number of gain control bits and p+1 is the number of phase control bits. The control may be implemented using binary-weighted gate fingers. For example and without limitation, 1, 2, 4, 8, and 16 unit gate fingers, respectively, are grouped and controlled by $b_0$, $b_1$, $b_2$, and so on. The amplitude and phase of the output signal may be expressed as a function of the control words and the amplitude of the input in-phase (I) and quadrature (Q) currents.

The total gate width of the transistors in the two phase-adjust differential pairs may be scaled with respect to the main differential pair to further increase the accuracy of the phase control at the expense of a reduced phase control range. This is typically the case when the cell is employed to correct for small phase imbalances with better than one degree accuracy.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A method comprising:
   receiving an amplitude-control bit, a phase-control bit, and an input signal;
   modulating the amplitude of the input signal based on the amplitude-control bit and modulating the phase of the input signal based on the phase-control bit to produce an output signal, the output signal comprising an amplitude and a phase, there being three potential states for the output signal, the amplitude representing binary 0 in a first one of the three potential states, the amplitude representing binary 1 and the phase representing binary 0 in a second one of the three potential states, the amplitude representing binary 1 and the phase representing binary 1 in a third one of the three potential states, wherein the amplitude of the output signal represents binary 0 if the amplitude-control bit is binary 0, and the phase-control bit is binary 0 or binary 1, and wherein the amplitude of the output signal represents binary 1 and the phase of the output signal represents binary 0 if the amplitude-control bit is binary 1, and the phase-control bit is binary 0; and
   transmitting the output signal.

2. The method of claim 1, wherein the amplitude of the output signal is 0 when the amplitude of the output signal represents binary 0.

3. The method of claim 1, wherein the amplitude of the output signal is the same as an amplitude of the input signal when the amplitude of the output signal represents binary 1, and the phase of the output signal is the same as a phase of the input signal when the phase of the output signal represents binary 0.

4. The method of claim 1, wherein the amplitude of the output signal represents binary 1 and the phase of the output signal represents binary 1 if the amplitude-control bit is binary 1, and the phase-control bit is binary 1.

5. The method of claim 4, wherein the amplitude of the output signal is the same as an amplitude of the input signal when the amplitude of the output signal represents binary 1, and the phase of the output signal is a phase of the input signal shifted 180° when the phase of the output signal represents binary 1.

6. The method of claim 1, wherein:
   the input signal is a local oscillator (LO) signal or a first radio frequency (RF) signal, and
   the output signal is a second RF signal.

7. An apparatus comprising:
   an amplitude-control input configured to receive an amplitude-control bit;
   a phase-control input configured to receive a phase-control bit;
   a signal input configured to receive an input signal;
   a modulator configured to modulate the amplitude of the input signal based on the amplitude-control bit and modulate the phase of the input signal based on the phase-control bit to produce an output signal, the output signal comprising an amplitude and a phase, there being three potential states for the output signal, the amplitude representing binary 0 in a first one of the three potential states, the amplitude representing binary 1 and the phase representing binary 0 in a second one of the three potential states, the amplitude representing binary 1 and the phase representing binary 1 in a third one of the three potential states, wherein the amplitude of the output signal represents binary 0 if the amplitude-control bit is binary 0, and the phase-control bit is binary 0 or binary 1, and wherein the amplitude of the output signal represents binary 1 and the phase of the output signal represents binary 0 if the amplitude-control bit is binary 1, and the phase-control bit is binary 0; and
   a signal output for transmitting the output signal.

8. The apparatus of claim 7, wherein the amplitude of the output signal is 0 when the amplitude of the output signal represents binary 0.

9. The apparatus of claim 7, wherein the amplitude of the output signal is the same as an amplitude of the input signal when the amplitude of the output signal represents binary 1, and the phase of the output signal is the same as a phase of the input signal when the phase of the output signal represents binary 0.

10. The apparatus of claim 7, wherein the amplitude of the output signal represents binary 1 and the phase of the output signal represents binary 1 if the amplitude-control bit is binary 1, and the phase-control bit is binary 1.

11. The apparatus of claim 10, wherein the amplitude of the output signal is the same as an amplitude of the input signal when the amplitude of the output signal represents binary 1, and the phase of the output signal is a phase of the input signal shifted 180° when the phase of the output signal represents binary 1.

12. The apparatus of claim 7, wherein:
    the input signal is a local oscillator (LO) signal or a first radio frequency (RF) signal, and
    the output signal is a second RF signal.

13. An apparatus comprising:
    an amplitude-control input for receiving an amplitude-control bit;
    a phase-control input for receiving a phase-control bit;
    a signal input for receiving an input signal;
    a modulator configured to modulate the amplitude of the input signal based on the amplitude-control bit and modulate the phase of the input signal based on the phase-control bit to produce an output signal, the output signal comprising an amplitude and a phase, there being three potential states for the output signal, the amplitude representing binary 0 in a first one of the three potential states, the amplitude representing binary 1 and the phase representing binary 0 in a second one of the three potential states, the amplitude representing binary 1 and the phase representing binary 1 in a third one of the three potential states; and
    a signal output for transmitting the output signal;

wherein the modulator comprises:

a first pair of transistors comprising a first transistor and a second transistor, the first transistor comprising a first gate, a first drain, and a first source, the second transistor comprising a second gate, a second drain, and a second source, the first and second gates each being segmented, the first drain and the first source being alternatingly interspersed among the segments of the first gate, the second drain and the second source being alternatingly interspersed among the segments of the second gate, the first and second sources being connected to each other; and a second pair of transistors comprising a third transistor and a fourth transistor, the third transistor comprising a third gate, a third drain, and a third source, the fourth transistor comprising a fourth gate, a fourth drain, and a fourth source, the third and fourth gates each being segmented, the third drain and the third source being alternatingly interspersed among the segments of the third gate, the fourth drain and the fourth source being alternatingly interspersed among the segments of the fourth gate, the third and fourth sources being connected to each other, the first and third drains being connected to each other, the second and fourth drains being connected to each other.

* * * * *